(12) United States Patent
Wang et al.

(10) Patent No.: US 8,329,492 B2
(45) Date of Patent: Dec. 11, 2012

(54) MICRO ELECTRONIC DEVICE AND METHOD FOR FABRICATING MICRO ELECTROMECHANICAL SYSTEM RESONATOR THEREOF

(75) Inventors: Chuan-Wei Wang, Hsinchu (TW); Hsin-Hui Hsu, Hsinchu (TW); Sheng-Ta Lee, Hsinchu (TW)

(73) Assignee: Pixart Imaging Inc., Hsinchu (TW)

( * ) Notice: Subject to any disclaimer, the term of this patent is extended or adjusted under 35 U.S.C. 154(b) by 206 days.

(21) Appl. No.: 12/819,278

(22) Filed: Jun. 21, 2010

(65) Prior Publication Data
US 2011/0024850 A1 Feb. 3, 2011

(30) Foreign Application Priority Data

Jul. 29, 2009 (TW) ................................ 98125559 A

(51) Int. Cl.
*H01L 21/467* (2006.01)
(52) U.S. Cl. .... 438/50; 438/736; 438/739; 257/E21.486
(58) Field of Classification Search ............ 257/E21.486
See application file for complete search history.

(56) References Cited

U.S. PATENT DOCUMENTS

| 6,051,866 | A | * | 4/2000 | Shaw et al. .................... 257/417 |
| 6,180,536 | B1 | * | 1/2001 | Chong et al. .................. 438/745 |
| 6,535,318 | B1 | | 3/2003 | Wood et al. |
| 6,635,519 | B2 | | 10/2003 | Barber et al. |
| 6,887,732 | B2 | | 5/2005 | Gopal et al. |
| 7,074,635 | B2 | * | 7/2006 | Kim et al. ........................ 438/50 |
| 7,166,488 | B2 | | 1/2007 | MacDonald et al. |
| 7,932,118 | B2 | * | 4/2011 | Robert et al. .................... 438/53 |
| 8,030,112 | B2 | * | 10/2011 | Hsieh et al. ..................... 438/51 |
| 2003/0088960 | A1 | | 5/2003 | Seo et al. |
| 2006/0290449 | A1 | | 12/2006 | Piazza et al. |
| 2007/0281493 | A1 | | 12/2007 | Fucsko et al. |
| 2008/0102639 | A1 | * | 5/2008 | Cho et al. ....................... 438/702 |
| 2008/0142912 | A1 | | 6/2008 | Inaba et al. |
| 2009/0064785 | A1 | | 3/2009 | Fukuda et al. |
| 2010/0313660 | A1 | * | 12/2010 | Nishikage et al. ......... 73/514.32 |

* cited by examiner

*Primary Examiner* — Stephen W Smoot
(74) *Attorney, Agent, or Firm* — Chun-Ming Shih

(57) ABSTRACT

A method for fabricating a MEMS resonator is provided. A stacked main body including a silicon substrate, a plurality of metallic layers and an isolation layer is formed and has a first etching channel extending from the metallic layers into the silicon substrate. The isolation layer is filled in the first etching channel. The stacked main body also has a predetermined suspended portion. Subsequently, a portion of the isolation layer is removed so that a second etching channel is formed and the remained portion of the isolation layer covers an inner sidewall of the first etching channel. Afterwards, employing the isolation layer that covers the inner sidewall of the first etching channel as a mask, an isotropic etching process through the second etching channel is applied to the silicon substrate, thereby forming the MEMS resonator suspending above the silicon substrate. The method for fabricating MEMS resonator can be integrated with the process of fabricating the CMOS circuit, thereby the process of fabricating a microelectronic device can be simplified and the cost of fabricating a micro electronic device can be reduced. A micro electronic device is also provided in the present invention.

11 Claims, 5 Drawing Sheets

MICRO ELECTRONIC DEVICE AND METHOD FOR FABRICATING MICRO ELECTROMECHANICAL SYSTEM RESONATOR THEREOF

CROSS-REFERENCE

This application claims priority to a Taiwan application No. 098125559 filed Jul. 29, 2009.

BACKGROUND

1. Field of the Invention

The present invention relates to a micro electronic device and a method for fabricating a micro-electromechanical system (MEMS) resonator thereof, and particularly to a microelectronic device with low production cost and a method for fabricating a MEMS resonator thereof.

2. Description of the Related Art

MEMS technique has established a whole new technical field and industry. The MEMS technique has been widely used in a variety of microelectronic devices that have electronic and mechanical properties, for example, pressure sensors, accelerators and micro-microphones.

Generally, in a conventional method for fabricating a micro electronic device, an MEMS resonator and a complementary metal oxide semiconductor (CMOS) circuit of the micro electronic device are respectively disposed on two different substrates. And then, the MEMS resonator and the CMOS circuit disposed on the two different substrates are packaged together to form the micro electronic device. Thus, the conventional method is complicated and it is difficult to reduce the production cost of the micro electronic device.

Therefore, how to resolve the above issue to simplify the manufacturing process of the micro electronic device and to reduce the production cost of the micro electronic device has become an important topic in the related industry.

BRIEF SUMMARY

The present invention is directed to a method for fabricating an MEMS resonator so as to simplify the manufacturing process of the micro electronic device and to reduce the production cost of the micro electronic device.

The present invention is also directed to a micro electronic device with low production cost.

The present invention provides a method for fabricating an MEMS resonator, which includes the following steps. Firstly, a stacked main body having a predetermined suspended portion is formed, which includes a silicon substrate, a plurality of metallic layers and an isolation layer. An insulating layer is formed on the silicon substrate. The metallic layers are formed on the insulating layer. The stacked main body has at least a first etching channel extending from the metallic layers into the silicon substrate. The isolation layer is filled in the first etching channel. Subsequently, a portion of the isolation layer is removed so that at least a second etching channel is formed to expose the silicon substrate and a remained portion of the isolation layer covers an inner sidewall of the first etching channel. Afterwards, an isotropic etching process is applied to the silicon substrate through the second etching channel and the isolation layer covering the inner sidewall of the first etching channel is employed as a mask so that a portion of the silicon substrate under the predetermined suspended portion is removed.

The present invention also provides a micro electronic device including a silicon substrate, a CMOS circuit and an MEMS resonator. The CMOS circuit is formed on the silicon substrate. The silicon substrate has a hollow region. The MEMS resonator suspends above the hollow region and separated from the CMOS circuit by at least a second etching channel. The second etching channel communicates with the hollow region of the silicon substrate. The MEMS resonator includes a silicon layer, a plurality of metallic layers disposed above the silicon layer and an isolation layer covering the sidewalls of the silicon layer and the sidewalls of the metallic layers.

The method for fabricating the MEMS resonator can be integrated with the process of fabricating the CMOS circuit. Thus, the MEMS resonator and the CMOS circuit can be fabricated on a common substrate simultaneously, thereby simplifying the manufacturing process of the micro electronic device and reducing the production cost of the micro electronic device.

Additionally, the MEMS resonator fabricated by the above method includes the silicon layer having characteristic of anti-high-temperature and anti-mechanical-fatigue. Thus, the MEMS resonator has an excellent working performance.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1A:
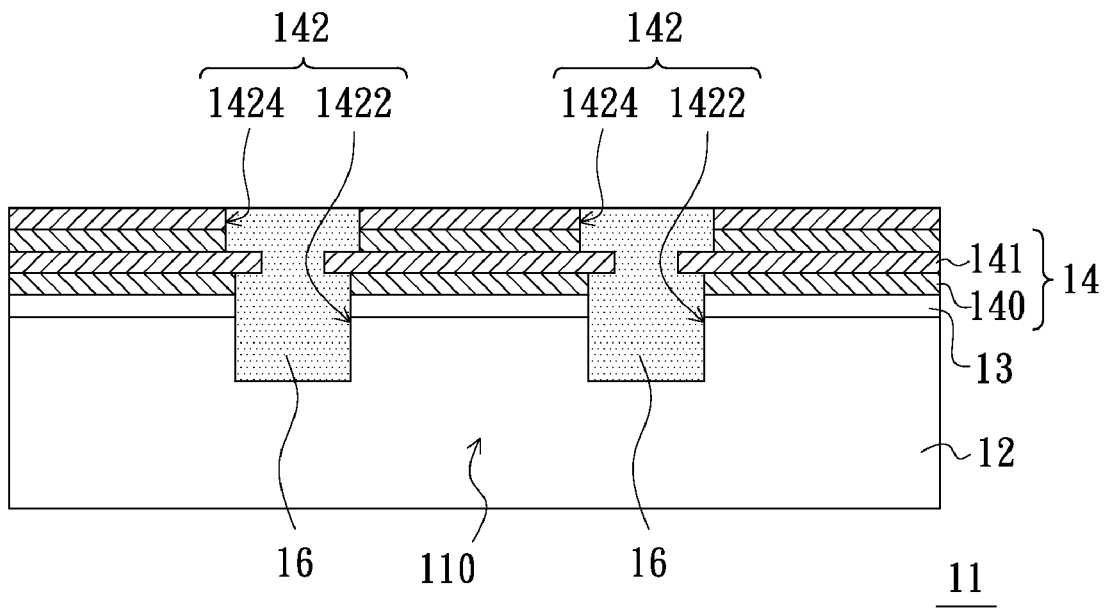
FIG. 1A to FIG. 1C illustrate a schematic cross-sectional view of a process flow of a method for fabricating an MEMS resonator in accordance with an embodiment of the present invention.
Figure 1B:
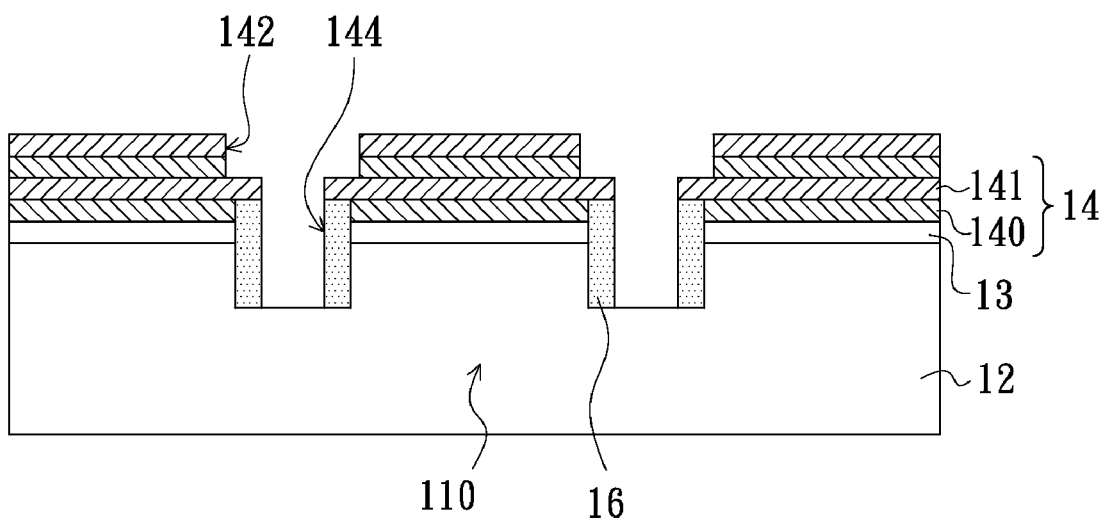
Figure 1C:
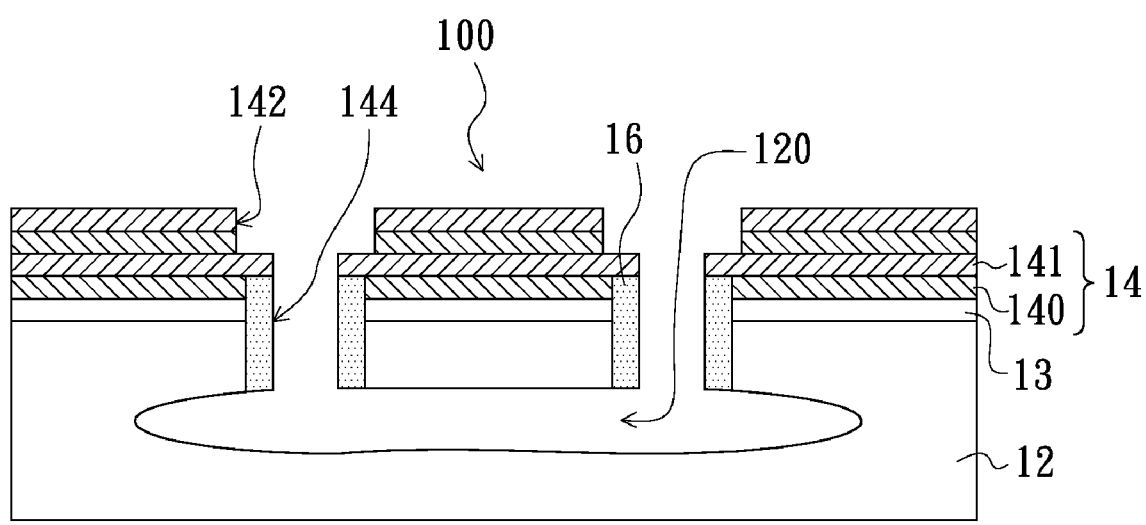

FIG. 1A to FIG. 1C illustrate a schematic cross-sectional view of a process flow of a method for fabricating an MEMS resonator in accordance with an embodiment of the present invention. Referring to FIG. 1A, in the present embodiment, first, a stacked main body 11 is formed, which includes a silicon substrate 12, a plurality of metallic layers 14 and an isolation layer 16. The stacked main body 11 has a predetermined suspended portion 110. The metallic layers 14 are formed above the silicon substrate 12. In the present embodiment, an insulating layer 13 is disposed between the metallic layers 14 and the silicon substrate 12 so as to prevent a short circuit of the metallic layers 14 and the silicon substrate 12. The insulating layer 13 can be, for example, non-doped polysilicon. The stacked main body 11 has a first etching channel 142 extending from the metallic layers 14 into the silicon substrate 12. The isolation layer 16 is filled in the first etching channel 142. In the present embodiment, the stacked main body 11 has two first etching channels 142. The two first etching channels 142 are located at two sides of the predetermined suspended portion 110. It is noted that the number of the first etching channel 142 is not limited by the present embodiment.

Figure 2A:
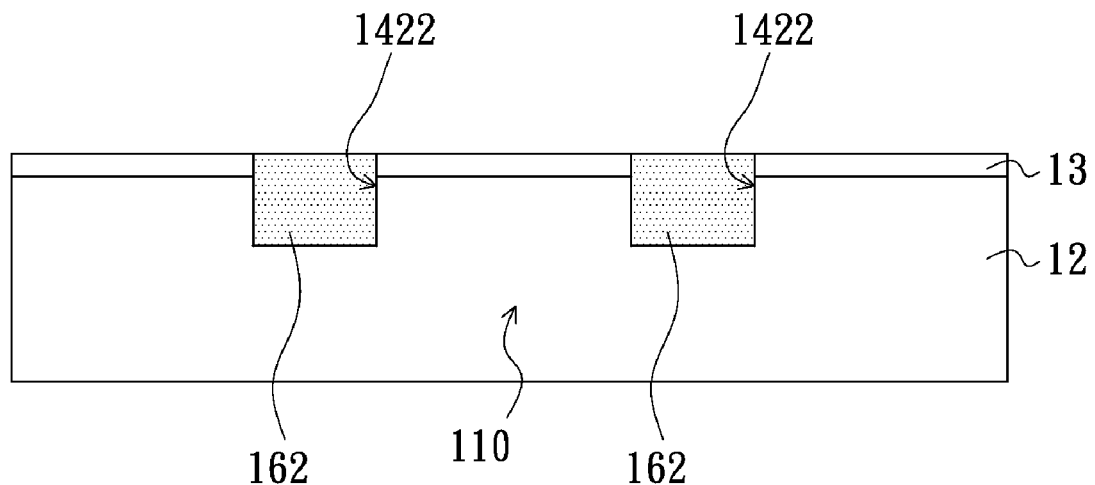
FIG. 2A to FIG. 2C illustrate a schematic cross-sectional view of a process flow of fabricating a stacked main body of the MEMS resonator in accordance with an embodiment of the present invention.
Figure 2B:
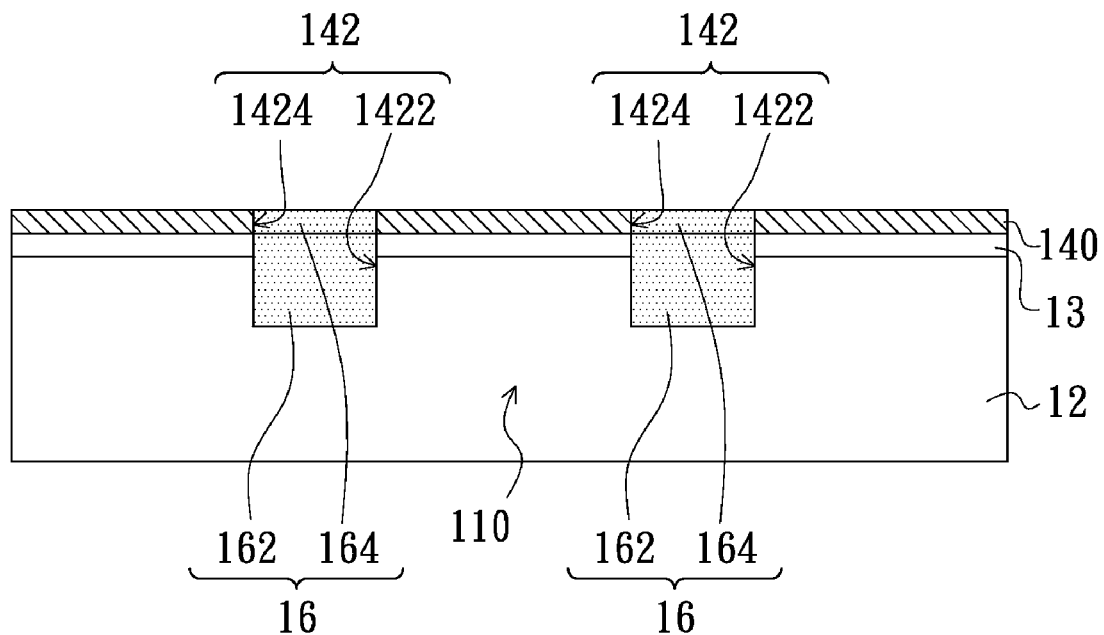
Figure 2C:
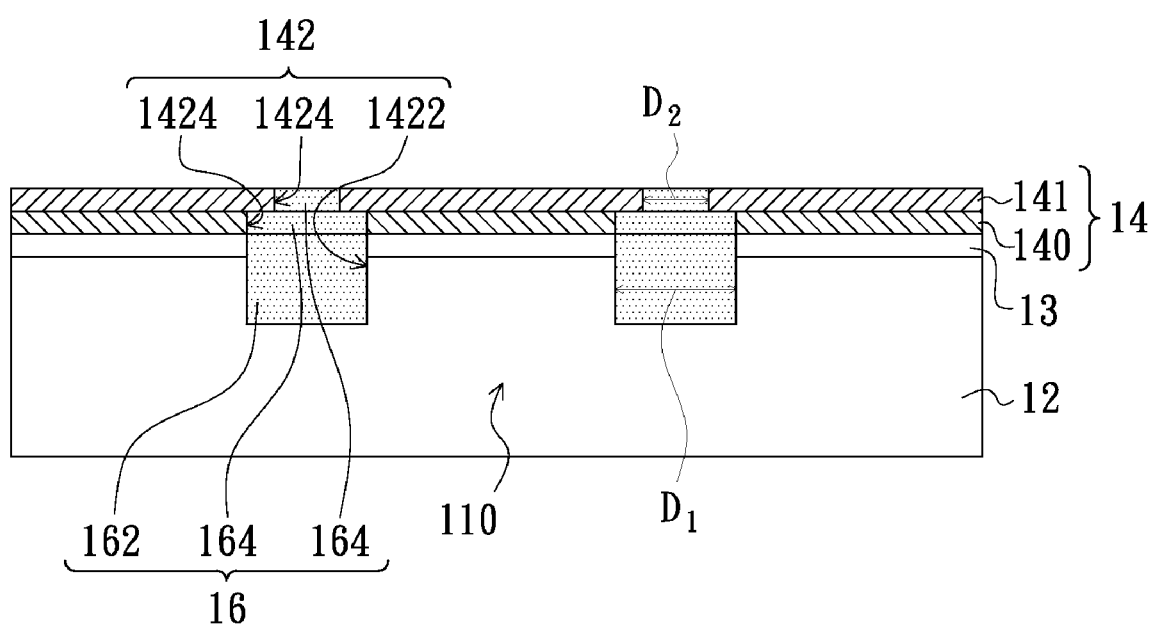

The metallic layers 14 include a plurality of tungsten layers 140 and a plurality of aluminum layers 141, and the tungsten layers 140 and the aluminum layers 141 are alternately stacked. The isolation layer 16 can include, for example, silicon oxide. FIG. 2A to FIG. 2C illustrate a schematic cross-sectional view of a process flow of fabricating a stacked main body 11 in accordance with an embodiment of the present invention. Referring to FIG. 2A, in the present embodiment, first, the silicon substrate 12 is provided. Next, the insulating layer 13 is formed on the silicon substrate 12. Next, the portions of the silicon substrate 12 and the corresponding portions of the insulating layer 13 are removed, thereby forming at least a first opening 1422. Next, a first oxide layer 162 is filled into the first openings 1422.

Referring to FIG. 2B and FIG. 2C, a plurality of metallic layers 14 are formed above the silicon substrate 12 in sequence. Each of the metallic layers 14 has a second opening 1424 above each of the first openings 1422. A second oxide layer 164 is filled in the second openings 1424 of each of the metallic layers 14. The isolation layer 16 is composed of the first oxide layer 162 and the second oxide layers 164. One of the first etching channel 142 is composed of one of the first opening 1422 and the second openings 1424.

In detail, in the present embodiment, after forming the first oxide layer 162, a tungsten layer 140 having the second openings 1424 is formed above the silicon substrate 12. Next, a second oxide layer 164 is filled in the second openings 1424, as shown in FIG. 2B. The second openings 1424 in the tungsten layer 140 are respectively located above the corresponding first opening 1422. Next, similarly, an aluminum layer 141 having the second openings 1424 is formed on the tungsten layer 140. Next, similarly, another second oxide layer 164 is filled in the second openings 1424 of the aluminum layer 141, as shown in FIG. 2C. The above steps are repeated so as to form the metallic layers 14 and the isolation layer 16 filled in the first etching channels 142, as shown in FIG. 1A. It is noted that, the first openings 1422 and the second openings 1424 can be formed by using an anisotropic etching process.

Particularly, the first etching channel 142 composed of the first opening 1422 and the second openings 1424 over the first opening 1422 extends into the silicon substrate 12. The extending depth of the first etching channel 142 in the silicon substrate 12 can be determined by the performance of the MEMS resonator to be fabricated. In detail, if the MEMS resonator to be fabricated needs a high resonant frequency, the extending depth of the first etching channel 142 in the silicon substrate 12 can be deepened.

Referring to FIG. 1B, after forming the stacked main body 11, the portions of the isolation layer 16 are removed to form the second etching channels 144 to expose the silicon substrate 12. In the present embodiment, two second etching channels 144 are correspondingly formed. The remaining portions of the isolation layer 16 covers a sidewall of each of the first etching channels 142. For example, the portions of the isolation layer 16 can be removed by, but not limited to, a deep reactive ion etching (DRIE) method.

In order to form the portions of the isolation layer 16 on the sidewall of each of the first etching channels 142, during the process of forming the stacked main body 11, a size of each second opening 1424 of at least one of the metallic layers 14 is smaller than that of the corresponding first opening 1422 so that the at least one of the metallic layers 14 protrudes above the corresponding first opening 1422. Thus, during forming the second etching channels 144, the at least one of the metallic layers 14 protruding above the first openings 1422 can be employed as a mask to remove the portions of the isolation layer 16. As a result, the portions of the isolation layer 16 on the sidewall of each of the first etching channels 142 can be remained.

Again, referring to FIG. 1A and FIG. 2C, in the present embodiment, the size D1 of each second openings 1424 of the aluminum layer 141 is designed to, but not limited to, be smaller than the size D2 of the corresponding first opening 1422 in the silicon substrate 12. In other embodiment, the size of each second opening 1424 of the tungsten layer 140 can be designed to be smaller than the corresponding first opening 1422 in the silicon substrate 12. It is noted that the size of each second opening 1424 of the tungsten layer 140 and the size of each second opening 1424 of the aluminum layer 141 can be both designed to be smaller than the corresponding first opening 1422.

Additionally, each metallic layer 14 of the metallic layers 14 can be used as the mask to remove the portions of the isolation layer 16. One skilled in the art can choose at least one of the metallic layers 14 used as the mask. In other words, the metallic layer 14 used as the mask is not limited by the above mentioned embodiment.

Referring to FIG. 1C, the portions of the isolation layer 16 covering on the sidewall of each of the first etching channels 142 is used as a mask, and an isotropic etching process is applied to etch the silicon substrate 12 through the second etching channels 144. Thus, the portions of the silicon substrate 12 under the predetermined suspended portion 110 are removed, thereby forming a hollow region 120. Thus, the MEMS resonator 100 partially suspending above the silicon substrate 12 is finished. In detail, the isotropic etching process for etching the silicon substrate 12 through the second etching channels 144 can be a chemical vapor etching, such as a xenon fluoride ($XeF_2$) vapor etching. Furthermore, because the portions of the isolation layer 16 covering on the sidewall of each of the first etching channels 142 is used as a mask, the silicon substrate 12 covered by the isolation layer 16 can be protected from etching and being removed. Thus, when the portions of the silicon substrate 12 under the predetermined suspended portion 110 are removed, the portion of the silicon substrate 12 can still be retained in the MEMS resonator 100.

As mentioned above, because silicon is a material having crystal lattices, and silicon has characteristic of anti-high-temperature and anti-mechanical-fatigue. Thus, the MEMS resonator 100 including a bottom composed of a silicon layer has an excellent working performance. The MEMS resonator 100 is, for example, a radio frequency resonator.

In accordance with an embodiment of the present invention, the MEMS resonator is fabricated by using a process for fabricating a CMOS circuit. Thus, the MEMS resonator and the CMOS circuit can be fabricated on a substrate, thereby reducing the subsequent assembling steps of the MEMS resonator and the CMOS circuit. To familiarize those who skilled in the prior art with further understanding the present invention, exemplary examples are taken below.

Figure 3:
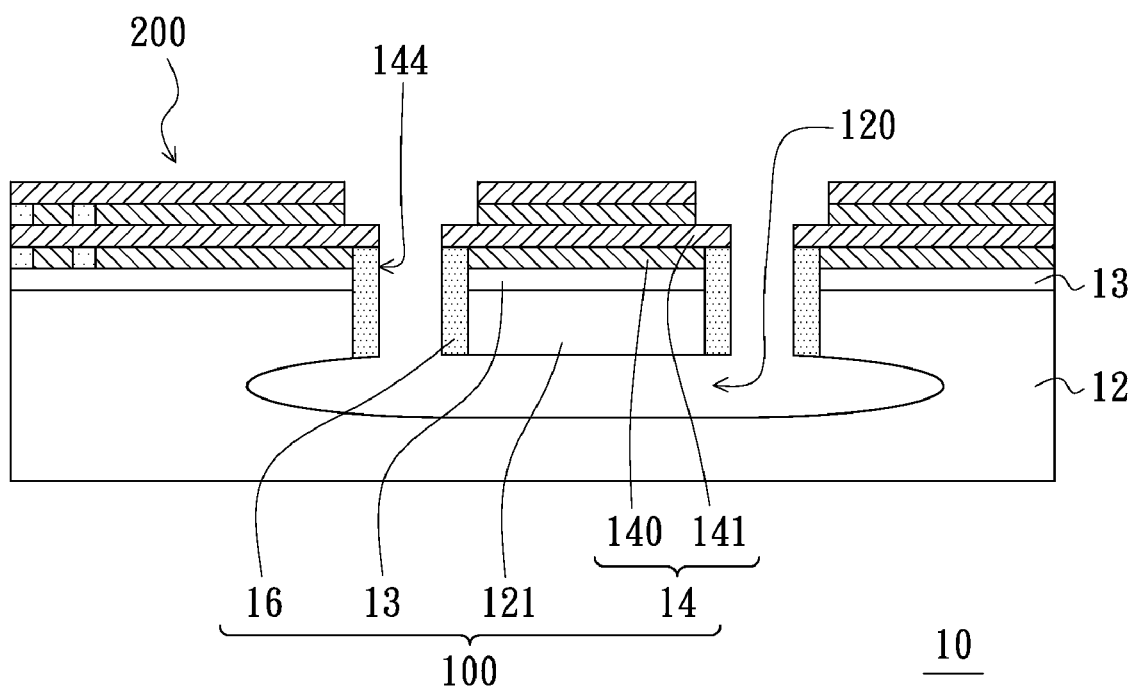
FIG. 3 is a partial, cross-sectional view of the micro electronic device in accordance with an embodiment of the present invention.

FIG. 3 is a partial, cross-sectional view of the micro electronic device in accordance with another embodiment of the present invention. Referring to FIG. 1A and FIG. 3, the micro electronic device 10 includes the MEMS resonator 100 and a CMOS circuit 200. The CMOS circuit 200 is, for example, fabricated on the silicon substrate by a process identical to the process of fabricating the stacked main body 11. The MEMS resonator 100 is suspended above the hollow region 120 of the silicon substrate 12. The MEMS resonator 100 includes a silicon layer 121, a plurality of metallic layers 14 and the isolation layer 16. The metallic layers 14 are disposed above the silicon layer 121. The metallic layers 14 include a plurality of tungsten layers 140 and a plurality of aluminum layers 141, and the tungsten layers 140 and the aluminum layers 141 are alternately stacked. In the present embodiment, the MEMS resonator 100 further includes the insulating layer 13 disposed between the metallic layers 14 and the silicon layer 121. The insulating layer 13 is used for preventing a short circuit of the metallic layers 14 and the silicon layer 12. The insulating layer 13 can be, for example, non-doped polysilicon. In addition, the isolation layer 16 covers the sidewalls of the silicon layer 121. In the present embodiment, the isolation layer 16 also covers the sidewalls of the tungsten layer 140 and the sidewall of the insulating layer 13. The insulating layer 13 can include, for example, silicon oxide.

The MEMS resonator 100 and the CMOS circuit 200 are separated by the second etching channel 144. The hollow region 120 in the silicon substrate 12 is formed by etching the silicon substrate 12 through the second etching channels 144. In other words, the second etching channels 144 are communicated with the hollow region 120 in the silicon substrate 12.

Therefore, the process of fabricating the MEMS resonator 100 can be integrated with the process of fabricating the CMOS circuit 200. In other words, the MEMS resonator 100 and the CMOS circuit 200 can be fabricated on the silicon substrate 12. Thus, some steps of the process of fabricating the MEMS resonator 100 and the process of fabricating the CMOS circuit 200 can be performed simultaneously. Thus, the process of fabricating the micro electronic device 10 can be simplified, thereby reducing the production cost of the micro electronic device.

In summary, in the method for fabricating the MEMS resonator, the isolation layer covering on the inner sidewall of each of the first etching channels is formed to protect the portion of the silicon substrate from etching and being removed during the process of forming the hollow region. Thus, when the portions of the silicon substrate under the predetermined suspended portion are removed to form the hollow region, the portion of the silicon substrate can still be retained in the MEMS resonator. Thus, the MEMS resonator includes a bottom composed of the silicon layer has an excellent working performance.

Additionally, the process of fabricating the MEMS resonator can be integrated with the process of fabricating the CMOS circuit. Thus, the MEMS resonator and the CMOS circuit can be fabricated on a substrate, thereby reducing the production cost of the micro electronic device.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for fabricating a MEMS resonator, comprising:
    forming a stacked main body comprising a silicon substrate, a plurality of metallic layers and at least an isolation layer, wherein the metallic layers are formed above the silicon substrate, the stacked main body has at least a first etching channel extending from the metallic layers into the silicon substrate, the isolation layer is filled in the first etching channel, and the stacked main body has a predetermined suspended portion;
    removing a portion of the isolation layer so that at least a second etching channel is formed to expose the silicon substrate and a remained portion of the isolation layer covers an inner sidewall of the first etching channel; and
    applying an isotropic etching process to the silicon substrate through the second etching channel and by employing the remained isolation layer covering the inner sidewall of the first etching channel as a mask so that the portion of the silicon substrate under the predetermined suspended portion is removed, thereby forming a hollow region inside the silicon substrate.

2. The method for fabricating the MEMS resonator as claimed in claim 1, wherein the first etching channel is formed by using an anisotropic etching process.

3. The method for fabricating the MEMS resonator as claimed in claim 1, wherein the portion of the isolation layer is removed by using a deep reactive ion etching method.

4. The method for fabricating the MEMS resonator as claimed in claim 1, wherein the isotropic etching process for etching inside the silicon substrate through the at least one second etching channel comprises a xenon fluoride vapor etching method.

5. The method for fabricating the MEMS resonator as claimed in claim 1, wherein the stacked main body further comprises an insulating layer disposed between the metallic layers and the silicon substrate.

6. The method for fabricating the MEMS resonator as claimed in claim 5, wherein the steps of forming the stacked main body comprising:
    providing the silicon substrate;
    forming the insulating layer on the silicon substrate;
    removing a portion of the insulating layer and a portion of the silicon substrate so as to form at least a first opening;
    filling a first oxide layer in the first opening;
    forming the metallic layers in sequence, wherein each of the metallic layers has at least a second opening filled with a second oxide layer above the first opening, the isolation layer is composed of the first oxide layer and the second oxide layer, the first etching channel is composed of the first opening and the second openings, and the size of one of the second openings is smaller than the size of the first opening so that at least one of the metallic layers protrudes above the first opening.

7. The method for fabricating the MEMS resonator as claimed in claim 6, wherein during the process of forming the second etching channel, the metallic layers protruding above the first opening is used as a mask to remove the portion of the isolation layer.

8. The method for fabricating the MEMS resonator as claimed in claim 5, wherein the insulating layer comprises non-doped polysilicon.

9. The method for fabricating the MEMS resonator as claimed in claim 1, wherein the metallic layers comprises tungsten layers and aluminum layers alternately stacked.

10. The method for fabricating the MEMS resonator as claimed in claim 1, wherein the isolation layer comprises silicon oxide.

11. The method for fabricating the MEMS resonator as claimed in claim 1, wherein the stacked main body comprises a plurality of first etching channels located at two sides of the predetermined suspended portion.

\* \* \* \* \*